United States Patent
Liu et al.

(10) Patent No.: US 10,170,329 B2
(45) Date of Patent: Jan. 1, 2019

(54) SPACER FORMATION FOR SELF-ALIGNED MULTI-PATTERNING TECHNIQUE

(71) Applicant: Tokyo Electron Limited, Tokyo (JP)

(72) Inventors: Eric Chih-Fang Liu, Albany, NY (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/708,264

(22) Filed: Sep. 19, 2017

(65) Prior Publication Data

US 2018/0082851 A1 Mar. 22, 2018

Related U.S. Application Data

(60) Provisional application No. 62/396,952, filed on Sep. 20, 2016.

(51) Int. Cl.
*H01L 21/308* (2006.01)
*H01L 21/311* (2006.01)
*H01L 29/66* (2006.01)
*H01L 21/02* (2006.01)

(52) U.S. Cl.
CPC .... *H01L 21/3086* (2013.01); *H01L 21/31116* (2013.01); *H01L 21/31138* (2013.01); *H01L 29/66795* (2013.01); *H01L 21/0206* (2013.01)

(58) Field of Classification Search
CPC .................. H01L 21/31116; H01L 21/31138
See application file for complete search history.

(56) References Cited

U.S. PATENT DOCUMENTS

| | | | |
|---|---|---|---|
| 6,333,268 B1 * | 12/2001 | Starov | G03F 7/42 |
| | | | 216/63 |
| 9,263,283 B2 | 2/2016 | Sekine et al. | |
| 9,269,590 B2 | 2/2016 | Luere et al. | |
| 9,478,433 B1 * | 10/2016 | Zhou | H01L 21/0337 |
| 2009/0258492 A1 | 10/2009 | Sant et al. | |
| 2010/0136792 A1 | 6/2010 | Mebarki et al. | |
| 2011/0059616 A1 | 3/2011 | Narishige et al. | |
| 2013/0302987 A1 | 11/2013 | Abatchev et al. | |
| 2015/0155176 A1 | 6/2015 | Mignot et al. | |
| 2016/0027658 A1 | 1/2016 | Peng et al. | |

FOREIGN PATENT DOCUMENTS

WO  2013047464 A1  4/2013

OTHER PUBLICATIONS

International Searching Authority, Search Report and Written Opinion issued in counterpart International Patent Appl. No. PCT/US2017/052202 dated Jan. 9, 2018, 12 pp.

* cited by examiner

*Primary Examiner* — Duy Vu N Deo
(74) *Attorney, Agent, or Firm* — Wood Herron & Evans LLP

(57) ABSTRACT

Embodiments of systems and methods for spacer formation for SAMP techniques are described. In an embodiment a method includes providing a substrate with a spacer having a conformal coating. The method may also include performing a spacer freeze treatment process. Additionally, the method may include performing an etch and clean process on the substrate. Further, the method may include controlling the spacer treatment process and etch and clean process in order to achieve spacer formation objectives.

17 Claims, 8 Drawing Sheets

SPACER FORMATION FOR SELF-ALIGNED MULTI-PATTERNING TECHNIQUE

CROSS-REFERENCE TO RELATED APPLICATIONS

The present application claims the benefit of U.S. Provisional Application No. 62/396,952, filed on Sep. 20, 2016, entitled "Spacer Formation for Self-Aligned Multi-Patterning Technique," which is incorporated herein by reference in its entirety.

BACKGROUND OF THE INVENTION

Field of Invention

The present invention relates to systems and methods for substrate processing, and more particularly to a method and system for spacer formation for self-aligned multi-patterning (SAMP) techniques.

Description of Related Art

SAMP techniques have been used for formation of components of fin-type field effect transistor (FinFET) devices, and the like. Dimension shrinkage is a one of the driving force in the development of integrated circuit processing. By reducing the size dimensions, cost-benefit and device performance boosts can be obtained. This scalability creates inevitable complexity in process flow, especially on patterning techniques. SAMP techniques have been widely adapted in sub-22 nm. FinFETs architecture, and it uses extra spacer etch steps to achieve pitch reduction requirements. Conventional SAMP flow has several steps, including core etch, spacer deposition, spacer etch and core pull. In this approach, the final feature critical dimension (CD) is controlled by spacer deposition thickness and spacer physical features, such as line edge roughness (LER) and line width roughness (LWR).

With the conventional SAMP approach, spacer etch often suffers distortion of the final spacer profile such as spacer facet and CD loss. It is, however, important to sustain the spacer profile and CD, because spacer profile has a substantial impact on pitch-walking effect, mask budget and CD targeting on final structure.

Further issues with prior processing techniques include spacer height loss due to non-uniform etch and lack of selectivity between the gate core material and the spacer material. Additionally, inadequate etch of spacer material may result in spacer footings, core-to-spacer step height differences, and the like. Such manufacturing defects may cause further device defects, reduce product production rates, limit the scale of manufactural devices, etc.

SUMMARY OF THE INVENTION

Embodiments of systems and methods for spacer formation for SAMP techniques are described. In an embodiment a method includes providing a substrate with a spacer having a conformal coating. The method may also include performing a spacer freeze treatment process. Additionally, the method may include performing an etch and clean process on the substrate. Further, the method may include controlling the spacer treatment process and etch and clean process in order to achieve spacer formation objectives.

An embodiment of a system may include an ion etch chamber and a controller coupled to the ion etch chamber. In an embodiment, the reactive ion etch chamber may be configured to receive a substrate with a spacer having a conformal coating, perform a spacer freeze treatment process; and perform an etch and clean process on the substrate. In an embodiment, the controller may be configured to control the spacer treatment process and etch and clean process in order to achieve spacer formation objectives.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
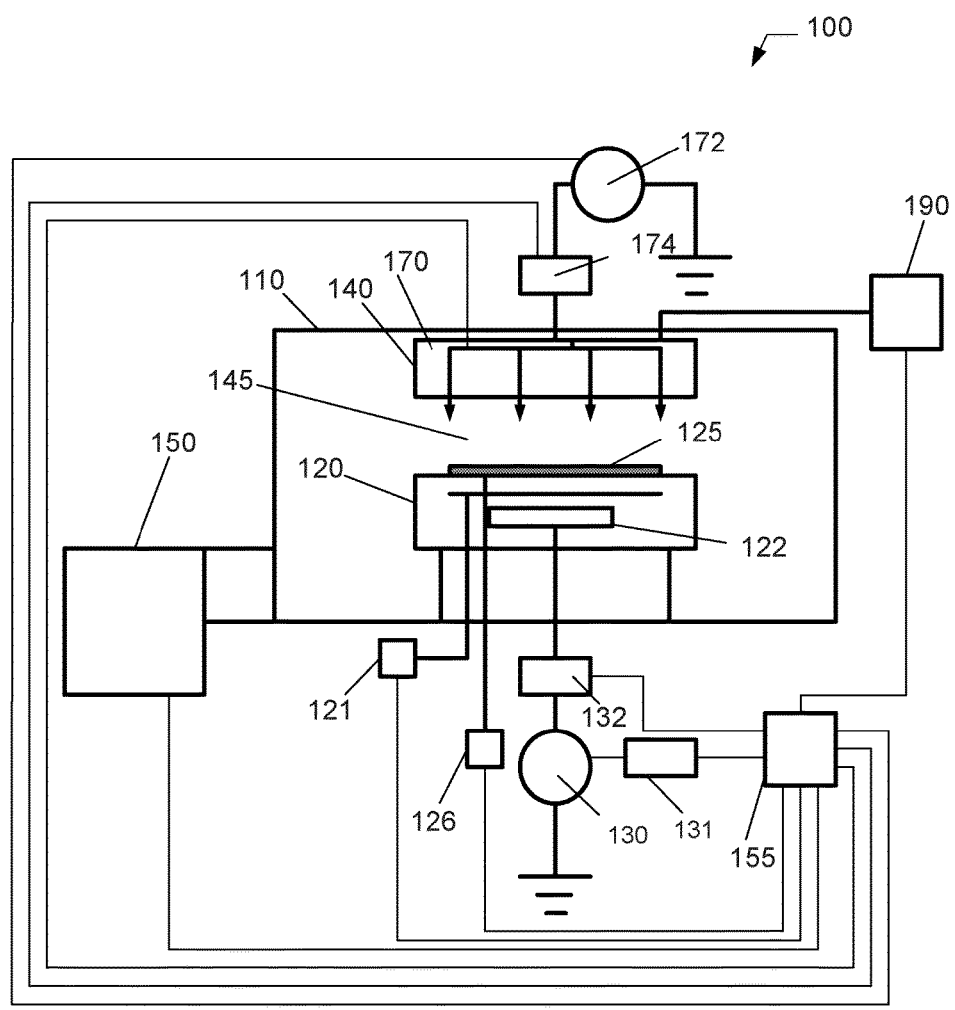
FIG. 1 is a schematic block diagram illustrating one embodiment of a plasma etch system configured for spacer formation for SAMP techniques.

Methods and systems for patterning sidewall shapes are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein the term "workpiece" means a composition of materials or layers formed on a substrate during one or more phases of a semiconductor device manufacturing process, the workpiece ultimately comprising the semiconductor device at a final stage of processing.

The present embodiments include systems and methods for spacer formation for SAMP techniques are described. In an embodiment a method includes providing a substrate with a spacer having a conformal coating. The method may also include performing a spacer freeze treatment process. Additionally, the method may include performing an etch and clean process on the substrate. Further, the method may include controlling the spacer treatment process and etch and clean process in order to achieve spacer formation objectives. Spacer formation objectives may include meeting predetermined specifications for spacer height, facet depth, CDs, core-to spacer step height difference, etc.

Beneficially, such embodiments may reduce height loss and asymmetric spacer formation. Additionally, the present embodiments may limit core-to-spacer step height differences, and additionally, may reduce spacer footings.

Referring now to the drawings, where like reference numerals designate identical or corresponding parts throughout the several views.

FIG. 1 is an embodiment of a system 100 for spacer formation according to SAMP techniques. In a further embodiment, system 100 may be configured to perform SAMP techniques for forming spacers as described with reference to FIGS. 5A-5D. An etch and post heat treatment system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as a reactive ion etch (RIE) reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 121. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz.

Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 2A:
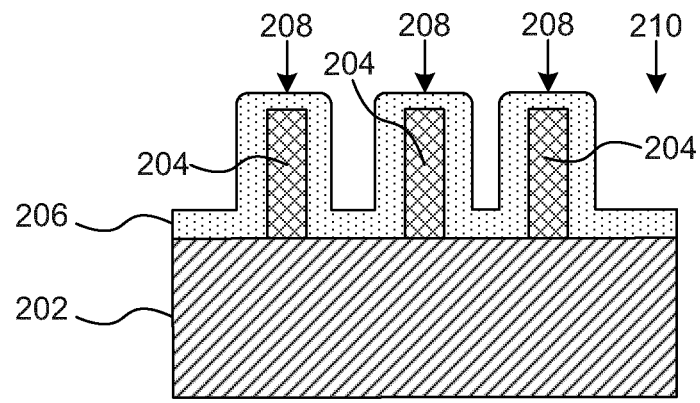
FIG. 2A is a schematic cross-section diagram illustrating one embodiment of a work piece for spacer formation.
Figure 2B:
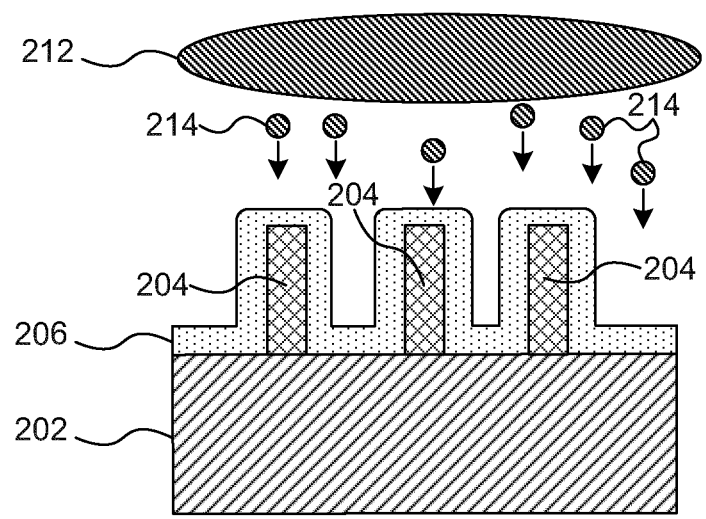
FIG. 2B is a schematic cross-section diagram illustrating one embodiment of a work piece for spacer formation.

One embodiment of a spacer etch process is described in FIGS. 2A-2B. In an embodiment, the workpiece includes a substrate 202 having one or more spacer cores 204 and a conformal coating 206 of spacer material. In an embodiment the conformal coating 206 may include one or more etch surfaces 208 disposed over the spacer cores 204. In an embodiment, the conformal coating 206 may be etched in an etch direction 210. In one such embodiment, the wafer 125 may comprise the substrate 202.

In an embodiment, the substrate 202 may be formed of materials comprising silicon, gallium arsenide, oxide, nitride, metal oxide, and metal nitride. The spacer cores 204 may comprise materials, including silicon, amorphous carbon, photoresist, oxide, nitride, and the like. The conformal coating 206 may comprise materials, including oxide, nitride, silicon, metal oxide, and metal nitride.

In the step of FIG. 2B, the conformal coating 206 and the spacer cores 204 may be etched using a reactive ion etch process. In the reactive ion etch process, a plasma field 212 comprising one or more reactive ions 214 may be formed over the workpiece. In such an embodiment, the reactive ions 214 may open the etch surfaces 208 and selectively etch the spacer cores 204. Following the reactive ion etch process, the workpiece of FIG. 3A may be formed.

Figure 3A:
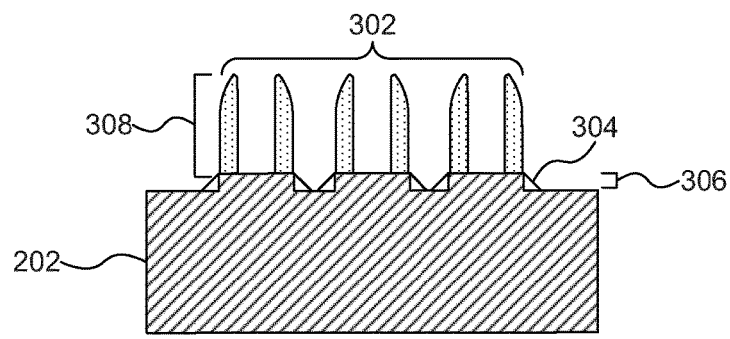
FIG. 3A is a schematic cross-section diagram illustrating a cross-section of the workpiece resulting from the process of FIGS. 2A-2B.

In the embodiment of FIG. 3A, a plurality of spacers 302 may be formed. Each spacer may have a height 308, which is significantly reduced from the original spacer height due to the heavy ion etch. Additional spacer footings 304 may be left in the trenches between spacers as a result of insufficient etch selectivity. Also, core-to-spacer height difference 306 into the substrate 202 may be a result of the ion etch process. In an embodiment, the core-to-spacer height difference 306 may be associated with the time required to etch the spacer core 204.

Figure 3B:
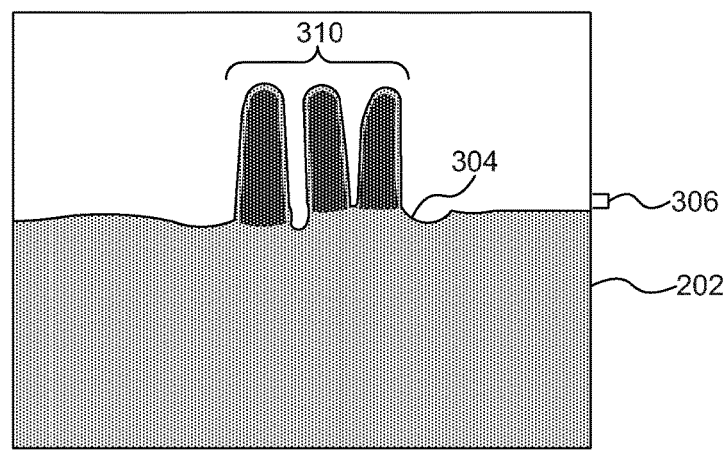
FIG. 3B is a cross-section diagram illustrating fabrication issues associated with the process of FIGS. 2A-2B.

FIG. 3B illustrates an embodiment of a set of gate devices 310 formed from non-uniform spacers 302 illustrated in FIG. 3A. In such an embodiment, the issues of spacer footers 304 and core-to-spacer height difference 306 may be carried into further phases of device processing.

Figure 4A:
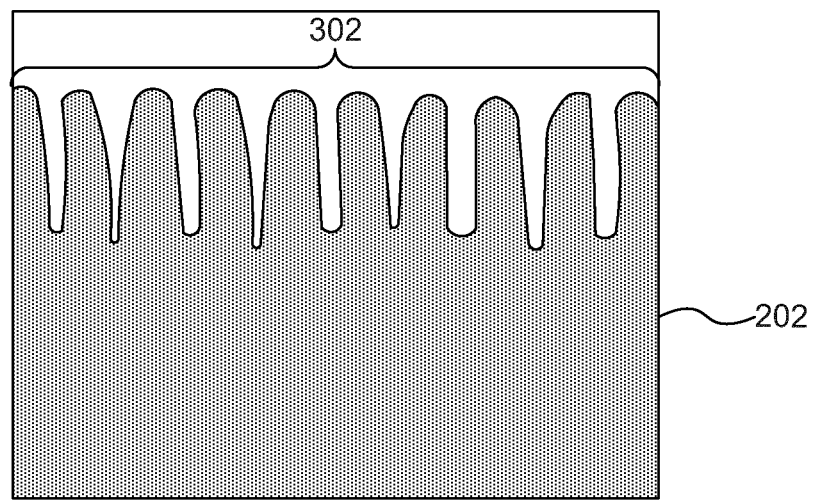
FIG. 4A is a schematic cross-section diagram illustrating a cross-section of the workpiece resulting from the process of FIGS. 2A-2B.
Figure 4B:
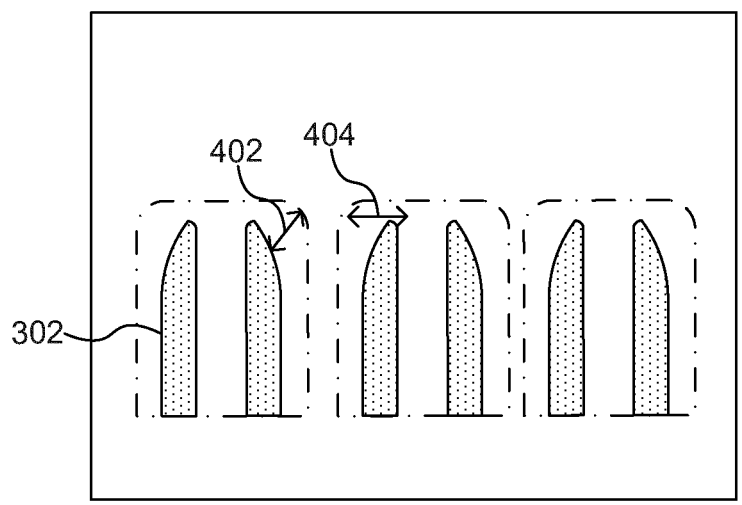
FIG. 4B is a cross-section diagram illustrating fabrication issues associated with the process of FIGS. 2A-2B.

FIG. 4A is a schematic cross-section diagram illustrating a cross-section of the workpiece resulting from the process of FIGS. 2A-2B. As shown in FIG. 4A, the spacers 302 resulting from the process of FIGS. 2A-2B may include substantial non-uniformity. In such embodiments, the spacer profile may be substantially compromised. As shown in FIG. 4B, the spacers 302 may suffer from faceting 402. Additionally, the critical dimension (CD) 404 of the spacer may be negatively affected by the excess exposure to the ion etch step in FIG. 2B.

Figure 5A:
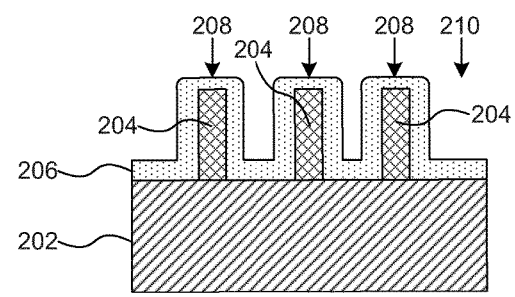
FIG. 5A is a schematic cross-section diagram illustrating one embodiment of a work piece for spacer formation.

FIGS. 5A-5D illustrate an alternative method for spacer formation for SAMP techniques. FIG. 5A is a schematic cross-section diagram illustrating one embodiment of a work piece for spacer formation. As in FIG. 2A, the workpiece may include a substrate 202, one or more spacer cores 204, and a conformal coating 206 having one or more etch surfaces 208 over the cores 204.

Figure 5B:
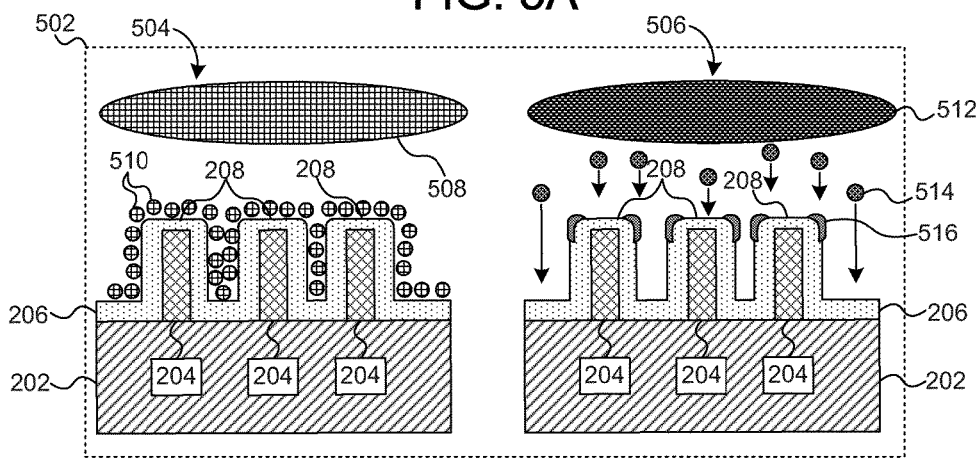
FIG. 5B is a schematic cross-section diagram illustrating one embodiment of a work piece for spacer formation.
Figure 5C:
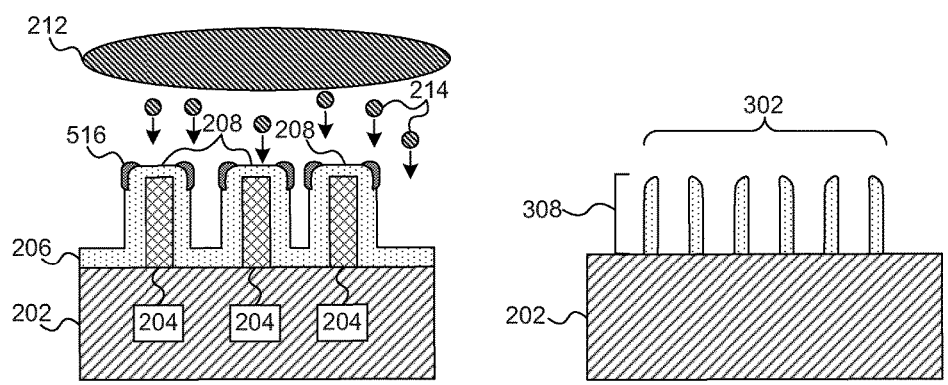
FIG. 5C is a schematic cross-section diagram illustrating one embodiment of a work piece for spacer formation.

FIG. 5B illustrates an embodiment of a spacer freeze treatment 502. In an embodiment, the spacer freeze treatment 502 may include a radical plasma etch 504 and an ion plasma etch 506. In the radical plasma etch 504, the workpiece is exposed to a radical plasma field 508 and the conformal coating 206 is deposited with radicals 510. In the ion plasma etch 506, the workpiece is exposed to ions 514 in an ion plasma field 512. The resulting combination of the radical plasma etch 504 and the ion plasma etch 506 is a buildup of byproducts 516, particularly on the edges and shoulders of the portions of the conformal layer along the etch surface 208. In an embodiment, the spacer freeze treatment 502 may be repeated to add to the buildup of byproducts 516. In an embodiment, the byproducts may include, for example, a combination of silicon, carbon, oxygen, nitrogen, and fluorine, which may be found in the conformal coating 206 and the radical and ion etch plasma gasses.

In an embodiment, the chemistries used for the radical plasma etch 504 may include $N_2$, $O_2$, CO, $CO_2$, $H_2$, HBr, $Cl_2$, $C_xH_y$, Ar, He, $C_xH_yF_z$, and $C_xF_y$. In an embodiment, the chemistries used for the ion plasma etch 506 may include $N_2$, $O_2$, CO, $CO_2$, $H_2$, HBr, $Cl_2$, $C_xH_y$, Ar, and He.

Figure 5D:
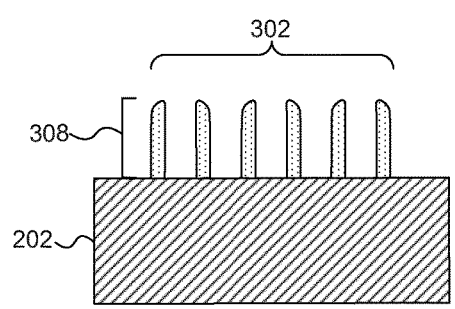
FIG. 5D is a schematic cross-section diagram illustrating one embodiment of a work piece for spacer formation.

Once the spacer freeze treatment 502 is complete, the etch surface 208 may be opened and the spacer cores 204 may be removed by bombardment of the workpiece with etch ions 214 in an ion plasma etch field 212. In an embodiment, the etch process used for opening the etch surface 208 may be the same etch process as described in FIG. 2B. For example, in such an embodiment, the ion plasma etch field 212 may be formed using a chemistry that includes $N_2$, $O_2$, CO, $CO_2$, $H_2$, HBr, $Cl_2$, $C_xH_y$, Ar, He, $C_xH_yF_z$, and $C_xF_y$. In such an embodiment, the buildup of byproduct 516 may also be removed during the etch process of FIG. 5C. However, as shown in FIG. 5D, the buildup of byproduct 516 may substantially protect the spacer material in the conformal coating 206, and the resulting spacers 302 may be significantly improved as compared with the results of FIG. 3A.

Figure 6A:
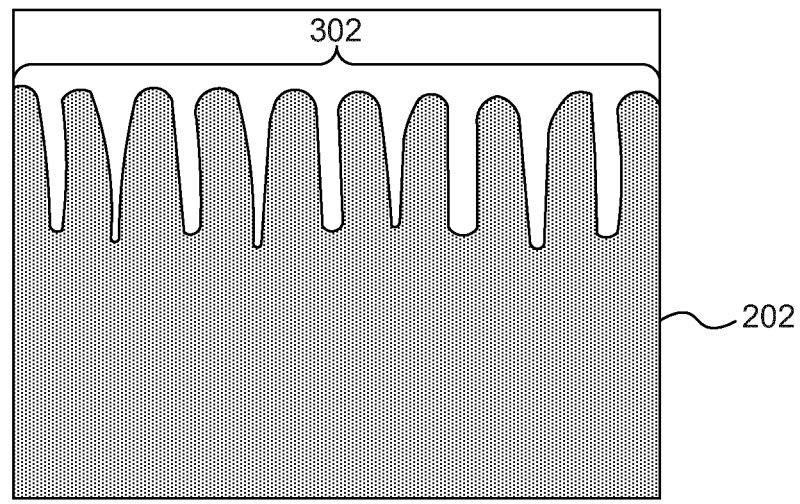
FIG. 6A is a schematic cross-section diagram illustrating a cross-section of the workpiece resulting from the process of FIGS. 5A-5D.
Figure 6B:
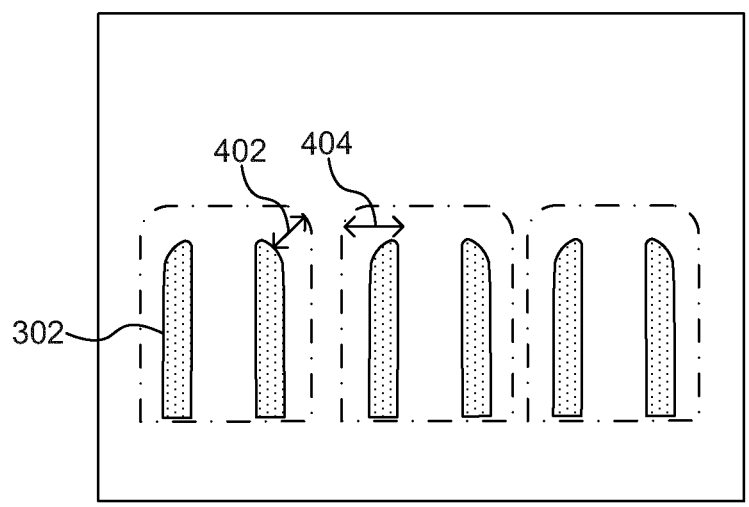
FIG. 6B is a cross-section diagram illustrating fabrication issues associated with the process of FIGS. 5A-5D.

As shown in FIG. 6A, spacer uniformity may be improved. Additionally, as shown in FIG. 6B, faceting 402 may be reduced, and the CD 404 may be improved, as compared with the spacers 302 resulting from the processes of FIGS. 2A-2B. Thus, the processes shown in FIG. 5A-5D demonstrates a substantial improvement over the process described in FIGS. 2A-2B. For example, as shown in FIG. 5D, the spacer height 308 in the workpiece of FIG. 5D may be greater than the spacer height 308 of the workpiece of FIG. 3A. Additionally, the core-spacer height difference 306 may be reduced, and the spacer footers 304 may be substantially eliminated.

Figure 7:
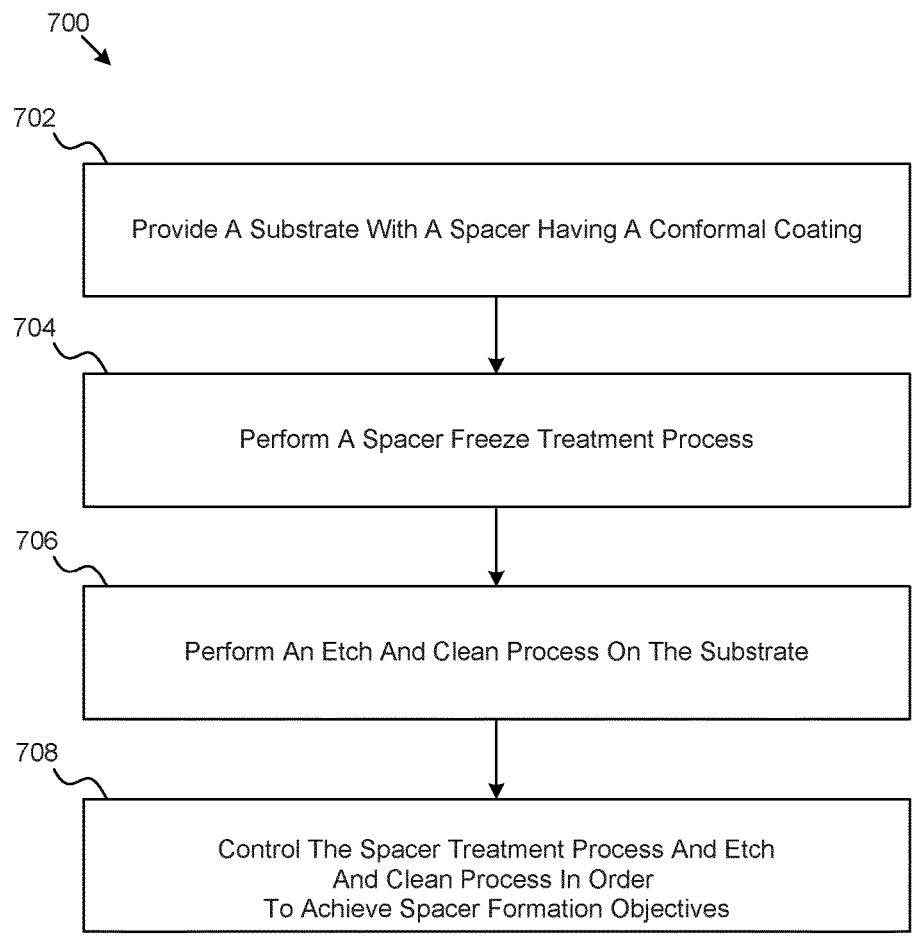
FIG. 7 is a schematic flowchart diagram illustrating one embodiment of a method for spacer formation for SAMP techniques.

FIG. 7 is a schematic flowchart diagram illustrating an overview of one embodiment of a method 700 for spacer formation for SAMP techniques. In an embodiment, the method 700 may include providing a substrate with a spacer having a conformal coating, as shown at block 702. The method 700 may also include performing a spacer freeze treatment process, as shown at block 704. Additionally, the method may include performing an etch and clean process on the substrate, as shown at block 706. Finally, the method 700 may include controlling the spacer treatment process and etch and clean process in order to achieve spacer formation objectives, as shown at block 708.

In an embodiment, controlling the spacer treatment process in order to achieve spacer formation objectives may include controlling flow rates of etch gasses into the chamber. Additionally, controlling the spacer treatment process may include controlling a pressure, or a temperature within the chamber 110. Additional controls may include controlling a radio frequency (RF) power or microwave (MW) power level used to generate the plasma fields 212, 508, and 512. One of ordinary skill will recognize additional parameters which may be controlled to meet processing objectives.

Figure 8:
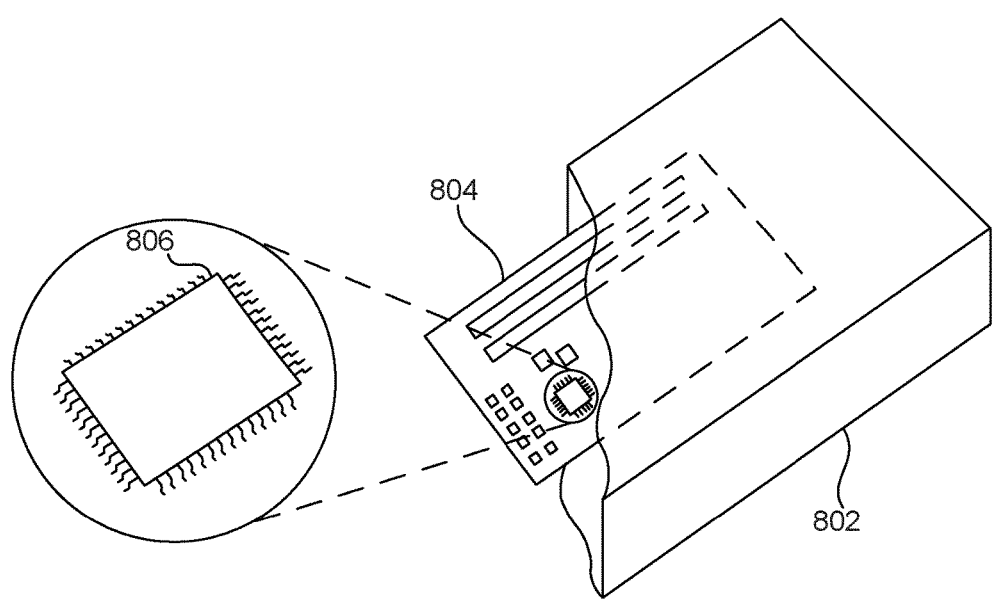
FIG. 8 is a schematic diagram illustrating one embodiment of a system that incorporates devices manufactured according to embodiments of the present SAMP techniques.

The embodiments of the processes and methods described herein may be used in commercial processes for manufacturing semiconductor-based products for inclusion in commercial products. For example, FIG. 8 illustrates an electrical device 802 comprising a printed circuit board (PCB). The electrical device 802 may be one of a number of commercially available products, including for example, computers, computer monitors, televisions, audio amplifiers, cameras, smartphones and personal data assistants, tablet computing devices, smart watches, application-specific processing equipment, sensor devices, medical devices, etc. One of ordinary skill will recognize that devices manufactured according to the present embodiments are not limited to any particular field.

The electrical device 802 may include one or more PCBs 804, the PCBs 804 comprising one or more semiconductor-based electrical components, such as chip package 806. Chip package 806 may include a segmented chip of a wafer having one or more features, such as the FinFET device manufactured according to the processes described in FIGS. 5A-5D disposed thereon. The chip may comprise, for example, a substrate 202. The chip may be packaged in a durable package for protection of the features disposed thereon. The chip package 806 may further include one or more contact pins configured to provide external access to certain contact points on the chip.

Advantageously, the size and density of the features disposed on the chip in chip package 806 may be small relative to devices manufactured with other techniques, because use of the spacer freeze treatment 502 allows for high resolution patterning of the semiconductor device, relative to previous methods.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method of forming a spacer pattern on a substrate, the method comprising:
   providing a substrate with a plurality of spacer cores having a conformal coating of spacer material thereon wherein the conformal coating includes bottom portions on the substrate between the plurality of spacer cores, sidewall portions on sidewalls of the plurality of spacer cores, top portions on top surfaces of the plurality of spacer cores, and shoulder portions joining the sidewall portions and the top portions;
   performing a spacer freeze treatment process that forms a buildup of byproducts on the shoulder portions of the conformal coating while leaving the top and bottom portions exposed;
   performing an etch and clean process on the substrate to remove the exposed top and bottom portions of the conformal coating and to remove the plurality of spacer cores to substantially leave the sidewall portions as the spacer pattern, wherein the buildup of byproducts serves as a protective layer to reduce etching of the sidewall portions; and
   controlling one or more process parameters of the spacer freeze treatment process and the etch and clean process in order to achieve one or more spacer formation objectives selected from a target height of the spacer pattern, a target maximum facet depth on the spacer pattern, a target critical dimension of the spacer pattern, a target maximum height difference between the plurality of spacer cores and the spacer pattern, a target uniformity of the spacer pattern, and a target maximum amount of spacer footings in the spacer pattern.

2. The method of claim 1, wherein performing the spacer freeze treatment process comprises performing a radical plasma etch.

3. The method of claim 2, wherein performing the radical plasma etch is performed using a plasma etch gas chemistry comprising a plasma etch gas selected from the group consisting of $N_2$, $O_2$, CO, $CO_2$, $H_2$, HBr, $Cl_2$, $C_xH_y$, Ar, He, $C_xH_yF_z$, and $C_xF_y$.

4. The method of claim 1, wherein performing the spacer freeze treatment process comprises performing an ion plasma etch.

5. The method of claim 4, wherein performing the ion plasma etch is performed using a plasma etch gas chemistry comprising a plasma etch gas selected from the group consisting of $N_2$, $O_2$, CO, $CO_2$, $H_2$, HBr, $Cl_2$, $C_xH_y$, Ar, and He.

6. The method of claim 1, further comprising repeating the spacer freeze treatment process in a cycle.

7. The method of claim 1, wherein the etch and clean process to remove the plurality of spacer cores is performed using a plasma etch gas chemistry comprising a plasma etch gas selected from the group consisting of $N_2$, $O_2$, CO, $CO_2$, $H_2$, HBr, $Cl_2$, $C_xH_y$, Ar, He, $C_xH_yF_z$, and $CF_y$.

8. The method of claim 1, wherein the material of the plurality of spacer cores comprises a material selected from a group of materials consisting of silicon, amorphous carbon, and a photoresist polymer.

9. The method of claim 1, wherein the conformal coating comprises an oxide layer or a nitride layer.

10. The method of claim 1, wherein forming the spacer pattern comprises a Self-Aligned Multi-Patterning (SAMP) technique for forming a fin-type field effect transistor (FinFET) structure.

11. The method of claim 10, wherein the FinFET comprises a sub-22 nm transistor architecture.

12. The method of claim 1, wherein the one or more process parameters of the spacer freeze treatment process are controlled to reduce spacer height loss and asymmetric formation.

13. The method of claim 1, wherein the one or more process parameters of the spacer freeze treatment process are controlled to reduce or eliminate the spacer footings.

14. The method of claim 1, wherein the one or more process parameters of the spacer freeze treatment process are controlled to reduce the height difference between the plurality of spacer cores and the spacer pattern.

15. The method of claim 1, wherein performing the etch and clean process further removes the buildup of byproducts.

16. The method of claim 15, wherein the etch and clean process is performed until the removal of the buildup of byproducts exposes the sidewall portion to being etched, the method thereafter further comprising repeating the performing the spacer freeze treatment process and performing the etch and clean process one or more times until formation of the spacer pattern is complete.

17. The method of claim 1, wherein the spacer freeze treatment process is repeated until the buildup of byproducts reaches a target thickness for the protective layer.

* * * * *

UNITED STATES PATENT AND TRADEMARK OFFICE
CERTIFICATE OF CORRECTION

PATENT NO. : 10,170,329 B2  
APPLICATION NO. : 15/708264  
DATED : January 1, 2019  
INVENTOR(S) : Eric Chih-Fang Liu et al.

Page 1 of 1

It is certified that error appears in the above-identified patent and that said Letters Patent is hereby corrected as shown below:

In the Specification

Column 1, Line 32, change "in sub-22 nm. FinFETs architecture" to --in sub-22 nm FinFETS architecture--.

In the Claims

Column 10, Line 10, Claim 7 change "$H_2$, HBr, $Cl_2$, $C_xH_y$ Ar, He, $C_xH_yF_z$, and $CF_y$." to --$H_2$, HBr, $Cl_2$, $C_xH_y$, Ar, He, $C_xH_yF_z$, and $C_xF_y$.--.

Signed and Sealed this  
Ninth Day of April, 2019

Andrei Iancu  
*Director of the United States Patent and Trademark Office*